(12) United States Patent
Chong et al.

(10) Patent No.: US 10,162,386 B2
(45) Date of Patent: Dec. 25, 2018

(54) DISPLAY APPARATUS

(71) Applicant: SAMSUNG DISPLAY CO., LTD., Yongin-si, Gyeonggi-do (KR)

(72) Inventors: Jongho Chong, Hwaseong-si (KR); Eunjung Lee, Seongnam-si (KR); Suyoung Kim, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 168 days.

(21) Appl. No.: 15/051,783

(22) Filed: Feb. 24, 2016

(65) Prior Publication Data

US 2017/0003716 A1    Jan. 5, 2017

(30) Foreign Application Priority Data

Jul. 2, 2015    (KR) .................. 10-2015-0094785

(51) Int. Cl.
| | |
|---|---|
| *G06F 1/16* | (2006.01) |
| *G09G 3/3291* | (2016.01) |
| *G09G 3/3266* | (2016.01) |
| *G09G 3/3258* | (2016.01) |
| *H04N 5/232* | (2006.01) |
| *G02F 1/00* | (2006.01) |
| *H01L 51/52* | (2006.01) |
| *H01L 27/32* | (2006.01) |

(52) U.S. Cl.
CPC .............. *G06F 1/1652* (2013.01); *G02F 1/00* (2013.01); *G06F 1/1626* (2013.01); *G06F 1/1641* (2013.01); *G06F 1/1677* (2013.01); *G06F 1/1694* (2013.01); *G09G 3/3258* (2013.01); *G09G 3/3266* (2013.01); *G09G 3/3291* (2013.01); *H04N 5/23216* (2013.01); *H04N 5/23293* (2013.01); *G06F 2203/04102* (2013.01); *G09G 2310/0278* (2013.01); *G09G 2380/02* (2013.01); *H01L 27/3276* (2013.01); *H01L 51/5237* (2013.01); *H01L 2251/5338* (2013.01)

(58) Field of Classification Search
CPC . G09G 2380/02; G09G 2300/04; G09G 5/003
See application file for complete search history.

(56) References Cited

U.S. PATENT DOCUMENTS

| | | | | |
|---|---|---|---|---|
| 7,855,879 | B2 * | 12/2010 | Kim | ............... G06F 1/1601 361/679.21 |
| 9,019,170 | B2 | 4/2015 | Kim | |
| 9,164,547 | B1 * | 10/2015 | Kwon | ............... G06F 1/1652 |
| 2002/0094846 | A1 * | 7/2002 | Kishimoto | ............ H04M 1/0214 455/566 |

(Continued)

FOREIGN PATENT DOCUMENTS

| | | |
|---|---|---|
| JP | 2011-119830 A | 6/2011 |
| KR | 10-2014-0054746 A | 5/2014 |

*Primary Examiner* — Nelson Rosario
*Assistant Examiner* — Scott Au
(74) *Attorney, Agent, or Firm* — Lee & Morse, P.C.

(57) ABSTRACT

A display apparatus includes a display panel and a folding part. The display panel includes an edge part curving in a first direction and a flat part connected the edge part. The folding part is below the flat part and is used to fold the display panel. The edge part includes a groove in a central portion of the edge part in a second direction crossing the first direction, and the groove extends in the first direction.

16 Claims, 10 Drawing Sheets

(56) References Cited

U.S. PATENT DOCUMENTS

| | | | |
|---|---|---|---|
| 2013/0082955 A1 | 4/2013 | Becze et al. | |
| 2013/0321485 A1* | 12/2013 | Eom | G09G 3/3208 345/690 |
| 2014/0183473 A1* | 7/2014 | Lee | H01L 51/0097 257/40 |
| 2015/0029683 A1 | 1/2015 | Kim et al. | |
| 2016/0178763 A1* | 6/2016 | Okada | H01L 27/14605 250/370.09 |

* cited by examiner

DISPLAY APPARATUS

CROSS-REFERENCE TO RELATED APPLICATION

Korean Patent Application No. 10-2015-0094785, filed on Jul. 2, 2015, and entitled, "Display Apparatus," is incorporated by reference herein in its entirety.

BACKGROUND

1. Field

One or more embodiments described herein relate to a display apparatus.

2. Description of the Related Art

In recent years, flexible display panels that are foldable or rollable have been developed. These panels may be manipulated by a user to have a preferred shape. One type of foldable display panel includes electrical elements on a plastic substrate and support parts for the panel that rotate relative to a central axis.

SUMMARY

In accordance with one or more embodiments, a display apparatus includes a display panel including an edge part curving in a first direction and a flat part connected the edge part; and a folding part, below the flat part, to fold the display panel, wherein the edge part includes a groove in a central portion of the edge part in a second direction crossing the first direction, the groove extending in the first direction. The edge part may include a first side that curves downwardly and a second side connected to the flat part. The display panel may have a first side in the first direction and a second side in the second direction, and the second side may be longer than the first side.

The display panel may include a non-display area on a predetermined area at a left side of the flat part in the first direction, on a predetermined area at upper and lower sides of the flat part in the second direction, on a predetermined area at a right of the edge part in the first direction, and on a predetermined area at upper and lower sides of the edge part in the second direction; and a display area on areas of the flat part and the edge part except for the non-display area.

The display apparatus may include a plurality of pixels in the display area; a plurality of scan lines to receive scan signals, the scan lines extending in the first direction and connected to the pixels; a plurality of data lines to receive data voltages, the data lines extending in the second direction and connected to the pixels; and a plurality of emission lines to receive emission signals, the emission lines extending in the first direction and connected the pixels, wherein the data lines detour the groove and extend in the second direction.

When the display panel is folded, the data voltages may not be applied to the pixels of the flat part and are applied to the pixels of the edge part. The folding part may be on a central portion of the display panel in the second direction and may fold the display panel upwardly relative to a virtual axis extending in the first direction. The folding part may include a rotational axis; a first support part connected to a first side of the rotational axis in the second direction; and a second support part connected to a second side of the rotational axis in the second direction, wherein a central portion of the rotator overlaps the virtual axis, and wherein the first and second support parts rotate upwardly with respect to the rotational axis.

The display apparatus may include a case to accommodate the display panel and the folding part. The case may include an upper case including a window edge part having substantially a same shape as the edge part and a window flat part having substantially a same shape as the flat part; and a lower case to accommodate the display panel and the folding part, the lower case below the upper case. The window edge part may include a wind groove that overlaps the groove and has substantially a same shape as the groove.

The lower case may include a rotational axis for the case; and first and second lower cases connected to respective sides of the rotational axis of the case in the second direction, wherein a central portion of the rotational axis of the case overlaps the virtual axis and wherein the first and second lower cases rotate upwardly relative to the rotational axis of the case.

The display apparatus may include a camera and a flash on a side part of the lower case opposite to the window edge part. The window edge part may display a camera icon for operating the camera and may include an image display part for displaying an image photographed by the camera. The camera icon and the image display part may be displayed on edge parts with respect to the groove.

In accordance with one or more other embodiments. a display apparatus includes a display panel including first and second edge parts and a flat part, the first and second edge parts curving in a first direction and the flat part disposed between the first and second edge parts; and a folding part, below the flat part, to fold the display panel, wherein: the first edge part includes a first groove in a central portion of the first edge part in a second direction crossing the first direction, the first groove extending in the first direction, the second edge part includes a second groove in a central portion of the second edge part in the second direction crossing the first direction, the second groove extending in the first direction, and the first and second edge parts have substantially symmetrical shapes.

In the first direction, the first edge part may have a first side curved downwardly and a second side connected to the flat part, and in the first direction, the second edge part may have a first side connected to the flat part and a second side curved downwardly. The folding part may be on a central portion of the display panel in the second direction to fold the display panel upwardly relative to a virtual axis extending in the first direction.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
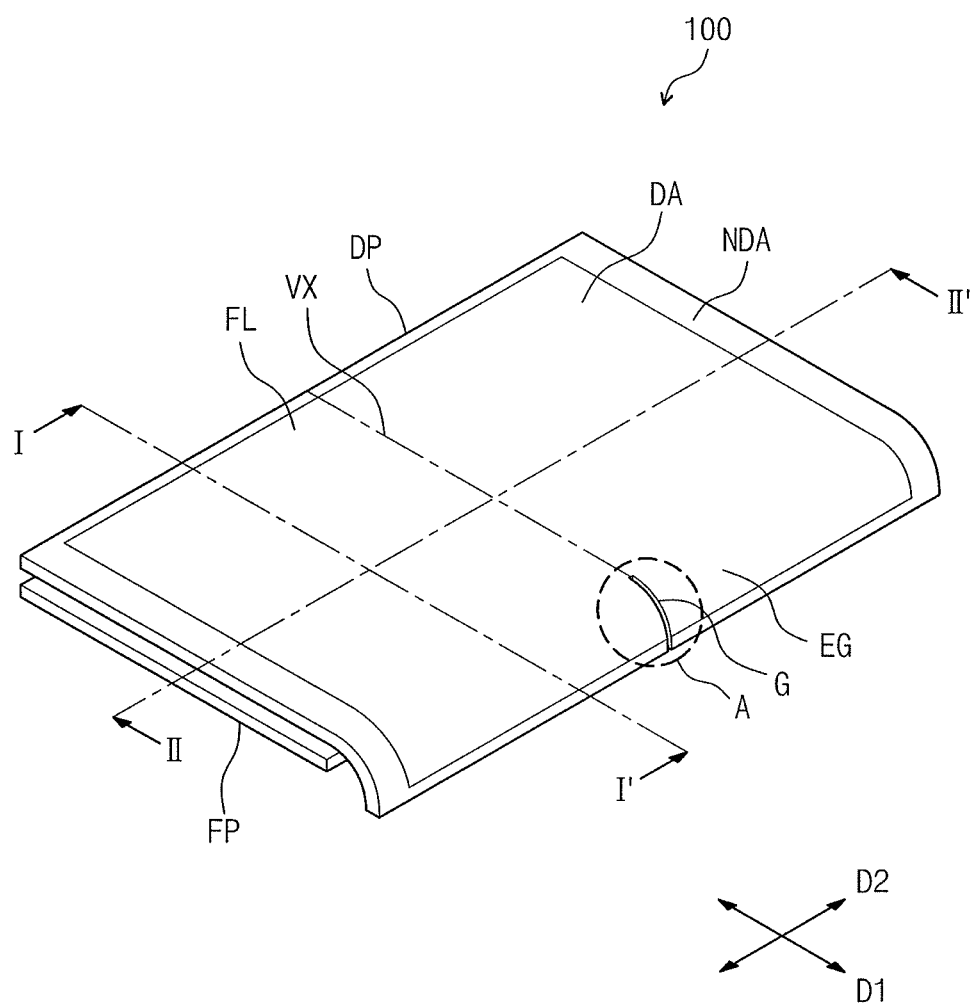
FIG. 1 illustrates an embodiment of a display apparatus.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
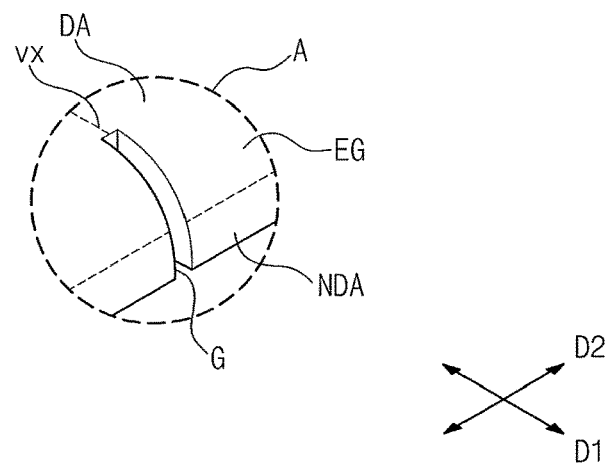
FIG. 2 illustrates an enlarged view of region A in FIG. 1.

FIG. 1 illustrates an embodiment of a display apparatus 100, and FIG. 2 illustrates an enlarged view of region A in FIG. 1. Referring to FIGS. 1 and 2, a display apparatus 100 includes a folding part FP disposed below a display panel DP.

The display panel DP is a flexible display panel. In one embodiment, the display panel DP may be an organic light emitting display panel including an organic light emitting device. In another embodiment, the display panel DP may be a liquid crystal display panel, an electrowetting display panel, or an electrophorestic display panel.

The display panel DP has a short side in a first direction D1 and a long side in a second direction D2 crossing to the first direction D1. The display panel 100 includes a display area DA for displaying an image and a non-display area NDA, on which an image is not displayed, that are substantially co=planar. The non-display area NDA is on a predetermined area of a boundary of the display panel DP and may surround the display area DA.

The display panel DP includes an edge part EG on a predetermined area at one side of the display panel DP and a flat part FL on an area of the display panel DP except for the edge part EG. The edge part EG of the display panel DP has a curved shape having a predetermined curvature in the first direction D1 and a flat shape in the second direction D2. In the first direction D1, the edge part EG has one side bent downwardly and another side connected to the flat part FL. The flat part FL has a flat shape. The display apparatus 100 including the display panel DP may be defined as an edge type display apparatus 100.

The non-display area NDA is on a predetermined area at a left side of the flat part FL in the first direction D1, and predetermined areas at upper and lower sides of the flat part FL in the second direction D2. The non-display area NDA is also on a predetermined area at a right side of the edge part EG in a first direction DR1, and predetermined areas at upper and lower sides of the edge part EG in the second direction DR2.

The display area DA is on areas of the flat part FL and the edge part EG, except for the non-display area NDA. Thus, a predetermined image may be displayed on the display area DA on the edge part EG.

A virtual axis VX on a central portion of the display panel DP in the second direction D2 and that extends in the first direction D1 may correspond to a folding axis of the display panel DP.

The folding part FP overlaps the flat part FL of the display panel DP. The folding part FP is below the display panel DP and has a short side in the first direction D1 and a long side in the second direction D2. The folding part FP may not be on the edge part EG. The folding part FP folds the display panel DP upwardly with respect to the virtual axis VX.

The display panel DP is on a predetermined area of a central portion of the edge part EG in the second direction D2, and includes a groove G extending from the edge part EG in the first direction D1. The groove G may be an area from which the display panel DP is at least substantially removed, and may overlap the virtual axis VX.

Figure 3:
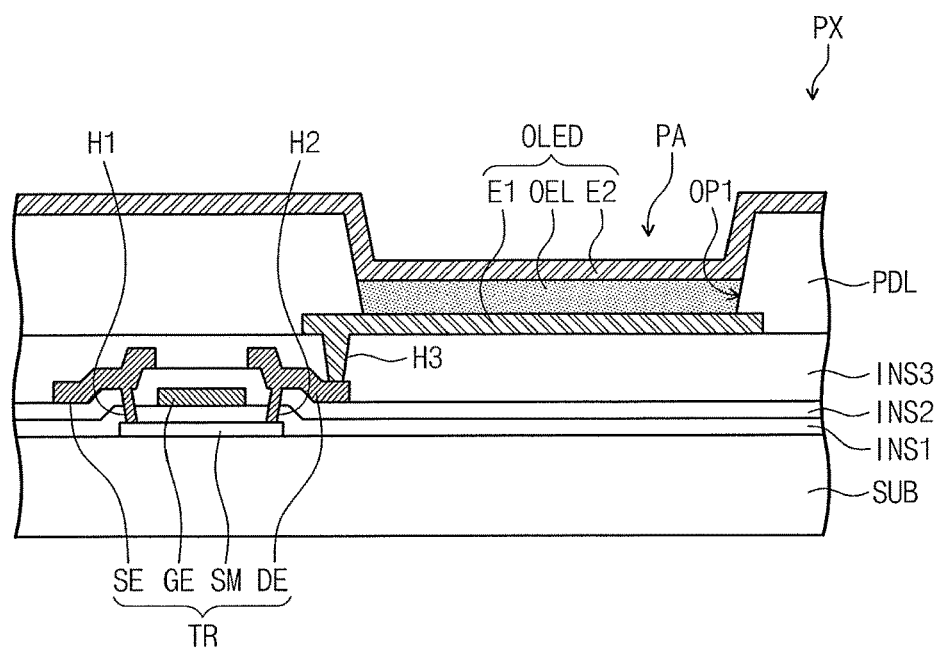
FIG. 3 illustrates an embodiment of a pixel.

FIG. 3 is a cross-sectional view of an embodiment of a pixel on the display area DA of the display panel DP in FIG. 2. This pixel may be representative of the other pixels in the display panel. Also, the pixel PX of the display panel DP is illustrated for an organic light emitting display panel.

Referring to FIG. 3, the pixel PX includes a transistor TR connected to a light emitting device OLED. The light emitting device OLED may include an organic light emitting device OLED. The transistor TR is on a transparent flexible substrate SUB made of plastic or another flexible material. The flexible substrate SUB allows the display panel DP to be a flexible display panel DP.

The transistor TR includes a semiconductor layer SM on the substrate SUB. The semiconductor layer SM may include an organic semiconductor or another material. Examples include an inorganic material (e.g., amorphous silicon or poly-silicon) and an oxide semiconductor. The transistor TR includes a channel area between a source area and drain area.

A first insulation layer INS1 is on the substrate SUB to cover the semiconductor layer SM. The first insulation layer INS1 may be, for example, an inorganic insulation layer including an inorganic material. A gate electrode GE of the transistor TR overlaps the semiconductor layer SM and is disposed on the first insulation layer INS1. The gate electrode GE may overlap the channel area of the semiconductor layer SM.

A second insulation layer INS2 is on the first insulation layer INS1 to cover the gate electrode GE. The second insulation layer INS2 may be defined as an interlayer insulation layer and may include, for example, an inorganic insulation layer including an inorganic material.

Source and drain electrodes SE and DE of the transistor TR may be spaced apart from each other on the second insulation layer INS2. The source electrode SE may be connected to the source area of the semiconductor layer SM through a first contact hole H1 passing through the first and second insulation layers INS1 and INS2. The drain electrode DE may be connected to the drain area of the semiconductor layer SM through a second contact hole H2 passing through the first and second insulation layers INS1 and INS2 A third insulation layer INS3 is on the second insulation layer INS2 to cover the source and drain electrodes SE and DE of the transistor TR. The third insulation layer INS3 may be, for example, an organic insulating layer including an organic material.

A first electrode E1 of the light emitting device OLED is on the third layer INS3. The first electrode E1 may be connected to the drain electrode DE through a third contact hole H3 passing through the third insulation layer INS3. The first electrode E1 may be a pixel electrode or an anode electrode. In one embodiment, the first electrode E1 may include a transparent electrode or a reflective electrode.

A pixel defining layer PDL, through which a predetermined area of the first electrode E1 is exposed, is on the first electrode E1 and the third insulation layer INS3. The pixel defining layer PDL includes an opening OP for exposing a predetermined area of the first electrode E1. An area including the opening OP corresponds to pixel area PA.

An organic light emitting layer OEL is on the first electrode E1 within the opening OP. The organic light emitting layer OEL may include an organic material that emits, for example, red, green, or blue light. In another embodiment, the organic light emitting layer OEL may generate white light based on a combination of organic materials that generate red, green, and blue light.

The organic light emitting layer OEL may respectively include a low molecular organic material or a high molecular organic material. The organic light emitting layer OEL may be, for example, a multi-layer that includes a hole injection layer (HIL), a hole transporting layer (HTL), an emission layer (EML), an electron transporting layer (ETL), and an electron injection layer (EIL). The hole injection layer may be on the first electrode E1, and the hole transporting layer, emission layer, electron transporting layer, and electron injection layer may be successively stacked on the hole injection layer.

A second electrode E2 is on the pixel defining layer PDL and the organic light emitting layer OEL. The second electrode EL2 may be a common electrode or a cathode electrode. The second electrode E2 may include a transparent electrode or a reflective electrode.

When the display panel DP is a front emission-type organic light emitting display panel, the first electrode E1 may be the reflective electrode and the second electrode E2 may be the transparent electrode. When the display panel DP is a rear emission-type organic light emitting device, the first electrode E1 may be the transparent electrode, and the second electrode E2 may be the reflective electrode.

The organic light emitting device OLED is on the pixel area PA and includes the first electrode E1, the organic light emitting layer OEL, and the second electrode E2 on the pixel area PA. The first electrode E1 may be an anode that is a hole injection electrode. The second electrode E2 is a cathode that is an electron injection electrode.

A first power voltage is applied to the first electrode E1 to allow the organic light emitting layer OEL of the light emitting device OLED to emit light by the transistor TR. A second power voltage having a polarity opposite to that of a driving power is applied to the second electrode E2. In this case, holes and electrons injected into the organic light emitting layer OEL are coupled to form excitons. When excitons transition to ground state, the light emitting device OLED emits light. The light emitting device OLED may emit red, green, or blue light, for example, according to the flow of current, to display predetermined image information.

Figure 4:
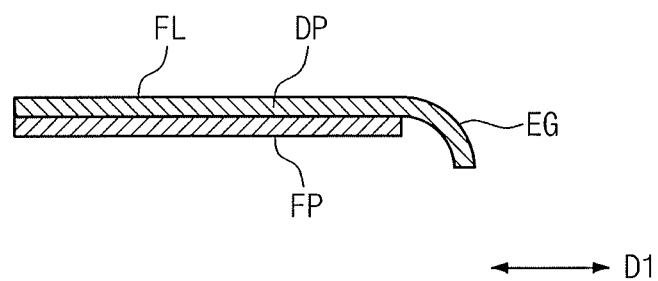
FIG. 4 illustrates a cross-sectional view taken along line I-I' in FIG. 1.
Figure 5:
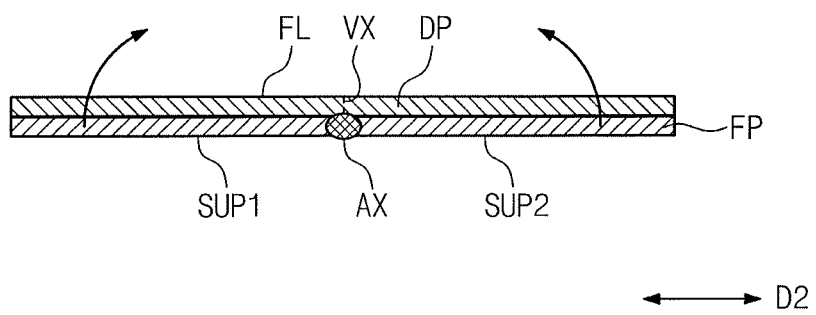
FIG. 5 illustrates a cross-sectional view taken along line II-II' in FIG. 1.

FIG. 4 is a cross-sectional view taken along line in FIG. 1, and FIG. 5 is a cross-sectional view taken along line II-II' of FIG. 1. Referring to FIGS. 4 and 5, the folding part FP overlaps the flat part FL of the display panel DP, but does not overlap the edge part EG. The folding part FP includes a rotational axis unit AX (or rotator) below the flat part FL of the display panel DP and first and second support parts SUP1 and SUP2. The rotational axis unit AX has a central portion that overlaps the virtual axis VX. The first support part SUP1 is connected to one side of the rotational axis unit AX in the second direction D2. The second support part SUP2 is connected to the other side of the rotational axis unit AX in the second direction D2.

The first support part SUP1 and the second support part SUP2 may rotate upwardly with respect to the rotational axis unit AX and then be folded. The first support part SUP1 and the second support part SUP2 may rotate so that top surfaces of the first and second support parts SUP1 and SUP2 face each other. The first and second support parts SUP1 and SUP2 may be parallel to each other in an upward direction.

When the first and second support parts SUP1 and SUP2 rotate with respect to the rotational axis unit AX and then are folded, the first and second support parts SUP1 and SUP2 move the display panel DP so that the display panel DP is folded. Thus, the display panel DP may be folded with respect to the virtual axis VX.

Figure 6:
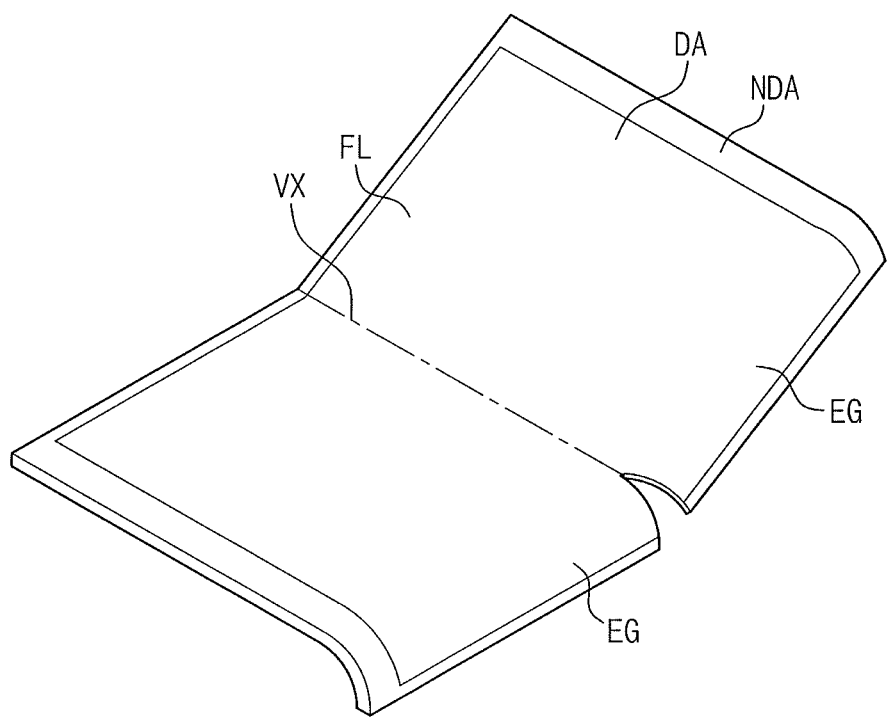
FIG. 6 illustrates a view of the display panel transitioning to a folded state.
Figure 7:
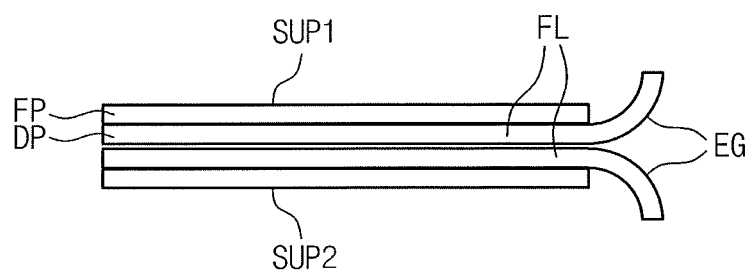
FIG. 7 illustrates an embodiment of the display panel in a folded state.

FIG. 6 illustrates an example of the display panel DP transitioning to a folded state, and FIG. 7 illustrates the display panel in a folded state by the folding part. For convenience of explanation, only the display panel DP is illustrated in FIG. 6. FIG. 7 illustrates a state in which the display panel DP is folded when viewed from the second direction D2.

Referring to FIGS. 6 and 7, as the first and second support parts SUP1 and SUP2 rotate with respect to the rotational axis unit AX and then are folded, the display panel DP is folded with respect to the virtual axis VX. In this case, as illustrated in FIG. 7, the display area DA of the flat part FL may not be exposed to a user, and the display area DA of the edge part EG may be exposed to the user.

In one embodiment, when the display panel DP is folded, the display area DA of the flat part FL does not display an image. In another embodiment, the display area DA of the edge part EG may display an image to a user. For example, a character icon, a Bluetooth icon, an alarm message, or other information may be displayed on the edge part EG to the user. According to one example, when the display panel DP is folded, the user may touch the Bluetooth icon to listen music through a Bluetooth earphone.

If the display panel of an edge-type display apparatus does not have a groove, it may be difficult to fold the display panel because the edge part has a curved shape. However, in accordance with one embodiment, a groove G is provided that overlaps the virtual axis VS that corresponds to the folding axis of the display panel DP. The groove G is disposed on the edge part EG of the display panel DP to allow the display panel DP to be easily folded.

Figure 8:
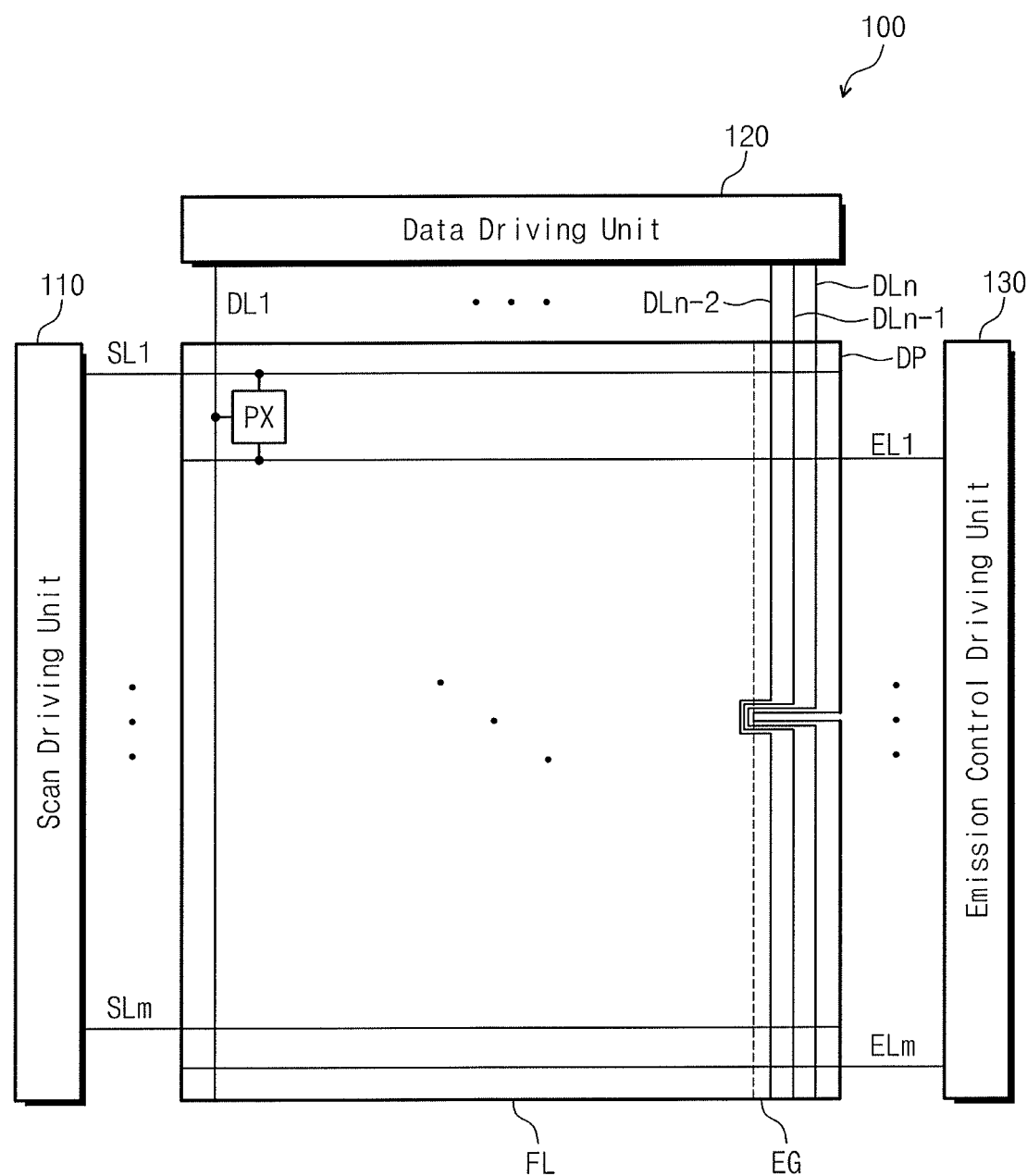
FIG. 8 illustrates an embodiment of a display apparatus.

FIG. 8 illustrates an embodiment of a display apparatus 100 which includes a display panel DP, a scan driving unit 110, a data driving unit 120, and an emission control driving unit 130. The display panel DP includes a plurality of pixels PX, a plurality of scan lines SL1 to SLm, a plurality of data lines DL1 to DLm, and a plurality of emission lines EL1 to ELm.

Only one pixel PX is illustrated in FIG. 8 for representative purposes. However, multiple pixels PX may be at intersections of the scan lines SL1 to SLm and the data lines DL1 to DLn to form a display panel DP having a matrix shape. The pixels PX are connected to the scan lines SL1 to SLm, the data lines DL1 to DLn, and the emission lines EL1 to ELm.

The scan lines SL1 to SLm extend in the first direction D1 and are connected to the scan driving unit 110. The scan lines SL1 to SLm receive scan signals from the scan driving unit 110.

The data lines DL1 to DLn extend in the second direction D2 and are connected to the data driving unit 120. The data lines DL1 to DLn receive data voltages from the data driving unit 120.

The emission lines EL1 to ELm extend in the first direction and are connected to the emission control driving unit 130. The emission lines EL1 to ELm receive emission signals from the emission control driving unit 130.

The scan driving unit 110 may be adjacent to one side of the display panel DP. The scan driving unit 110 generates and outputs scan signals. The scan signals may be sequentially outputted. The scan signals are provided to the pixels PX through respective ones of the scan lines SL1 to SLm.

The data driving unit 120 may be adjacent to another side of the display panel DP. The data driving unit 120 generates and outputs the data voltages. The data voltages are provided to the pixels PX through respective ones of the data lines DL1 to DLn.

The emission control driving unit 130 may be adjacent to another side of the display panel DP. The emission control driving unit 130 generates and outputs the emission signals. The emission signals are provided to the pixels PX through respective ones of the emission lines EL1 to ELm.

The display apparatus 100 may further include a timing controller for controlling operations of the scan driving unit 110, the data driving unit 120, and the emission control driving unit 130. The pixels PX receive the data voltages in response to scan signals. The data voltages are charged in the pixels PX. The pixels PX generate light corresponding to the data voltages in response to the emission signals. As a result, an image is displayed on the display panel DP.

When the display panel DP is folded, data voltages are not provided to pixels PX of the flat part FL. Thus, the pixels PX of the flat part FL may not be driven under these circumstances. However, data voltages are provided to pixels PX of the edge part EG. Thus, an image may be displayed on the edge part EG.

In one embodiment, the data lines DLn-2, DLn-1, and DLn on the edge part EG detours the groove G in an area where the groove G extends in the second direction D2. When the data lines DLn-2, DLn-1, and DLn detour the groove, the data lines DLn-2, DLn-1, and DLn may pass through the flat part FL. In one embodiment, the data lines DLn-2, DLn-1, and DLn may detour the groove G to extend in the second direction D2 and may then be connected to the pixels PX on the edge part EG. As a result, an image may be normally displayed on the edge part EG by the pixels PX.

Although three data lines DLn-2, DLn-1, and DLn are illustrated as being on the edge part EG, a different number of data lines may be on the edge part EG in another embodiment.

Figure 9:
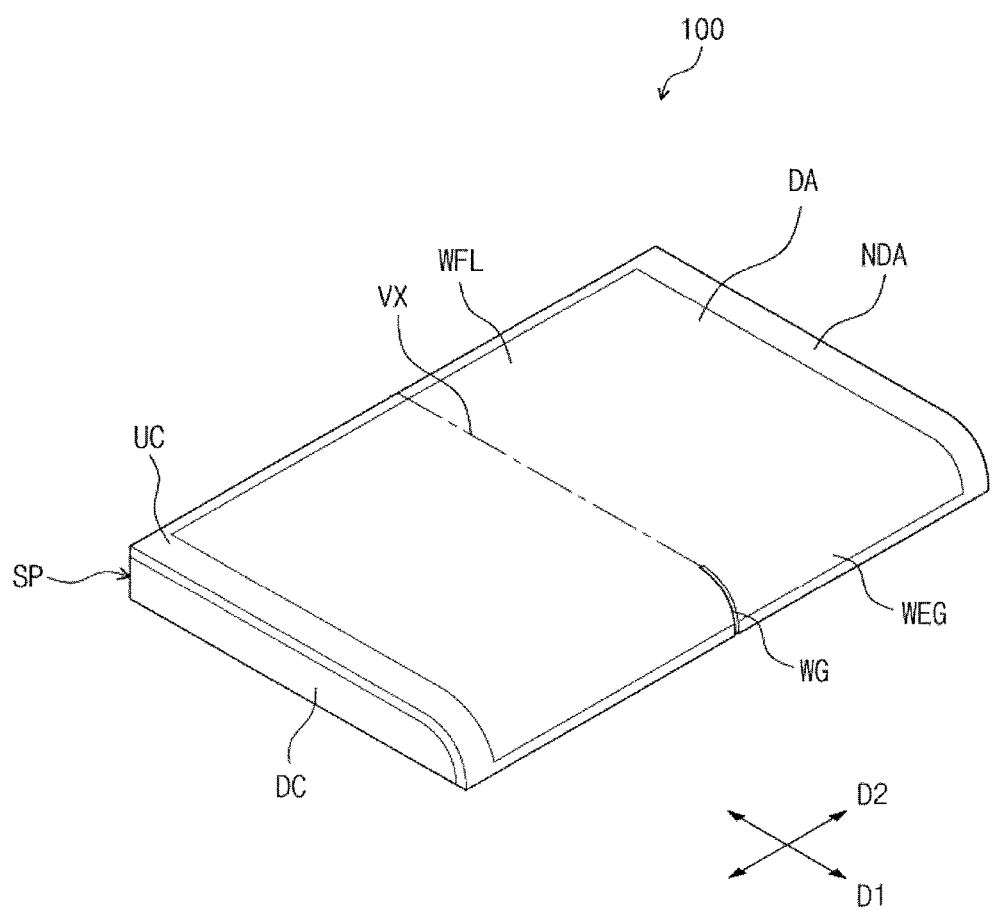
FIG. 9 illustrates an embodiment of a case for the display apparatus in FIG. 1.
Figure 10:
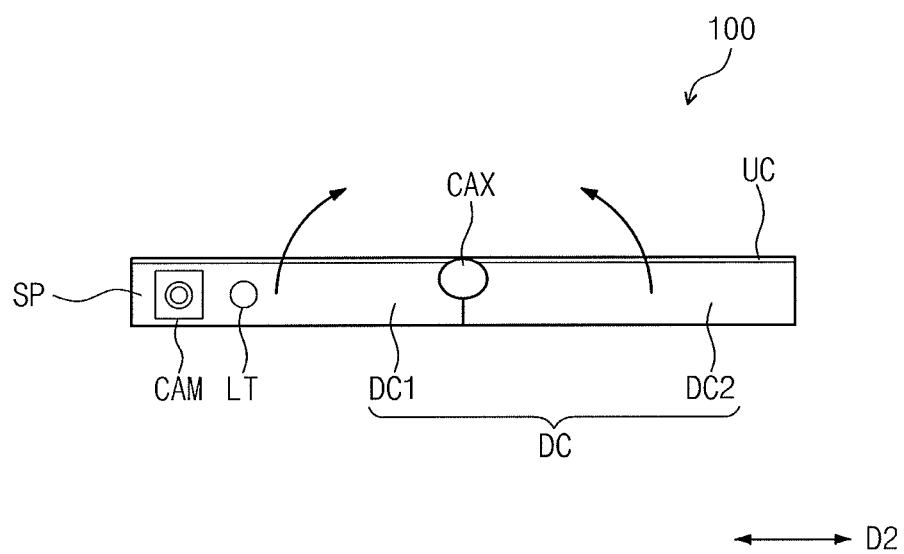
FIG. 10 illustrates a lateral view of the case.

FIG. 9 illustrates an embodiment of a case member accommodating the display panel and the folding part of the a display apparatus 100 of FIG. 1. FIG. 10 is a lateral view of the display apparatus 100 on an opposite side of a window edge part WEG in the display apparatus of FIG. 9.

Referring to FIGS. 9 and 10, the display apparatus 100 includes case members UC and DC accommodating the display panel DP and the folding part FP. The case members UC and DC include an upper case UC and a lower case DC connected to each other to accommodate the display panel DP and the folding part FP in an inner space thereof. The upper case UC is above the display panel DP to protect the display panel DP. The upper case UC may be a window member. Like the display panel DP, the upper case UC includes a display area DA for displaying an image and a non-display area NDA on which an image is not displayed. The display area DA of the upper case UC may transmit light to provide an image to the user.

The upper case UC includes the window edge part WEG, which may have the same shape as the edge part EG of the display panel DP, and a window flat part WFL, which may have the same shape as the flat part FL of the display panel DP. The edge part EG of the upper case UC overlaps the groove G of the display panel DP and includes a window groove WG having the same shape as the groove G.

The lower case DC is below the upper case UC and includes a side part SP on a side opposite to the window edge part WEG. The lower case DC accommodates the display panel DP and the folding part FP. Since the upper case UC covers the lower case DC, the display panel DP and the folding part FP may be accommodated in the inner space defined by the upper and lower cases UC and DC.

According to this configuration, one side of the display apparatus 100 includes a curved surface in the first direction D1. Another side of the display apparatus 100 includes the side part SP bent at a predetermined angle with respect to the top surface of the display apparatus 100. For example, one side of the display apparatus 100 may include a curved surface of a quarter circle in the first direction D1. Also, the other side of the display apparatus 100 may include the side part bent at a predetermined angle (e.g., about 90 degrees or another angle) with the top surface of display apparatus 100.

The lower case DC includes a case rotational axis unit CAX and first and second lower cases DC1 and DC2 that are connected to respective sides of the case rotational axis unit CAX in the second direction D2. The case rotational axis unit CAX has a central portion that overlaps the virtual axis VX. The lower case DC may be folded and unfolded with respect to the case rotational axis unit CAX. For example, the first lower case DC1 and the second lower case DC2 may rotate upwardly with respect to the case rotational axis unit CAX and then be folded.

In one embodiment, the display apparatus 100 includes a camera CAM and a flash LT on the side part SP of the lower case DC. The flash LT may include an LED. The camera CAM and the flash LT may be adjacent to each other. The camera CAM and the flash LT may be on one of the first lower case DC1 or the second lower case DC2. For example, the camera CAM and the flash LT may be on the side part SP of the first lower case DC1.

Figure 11:
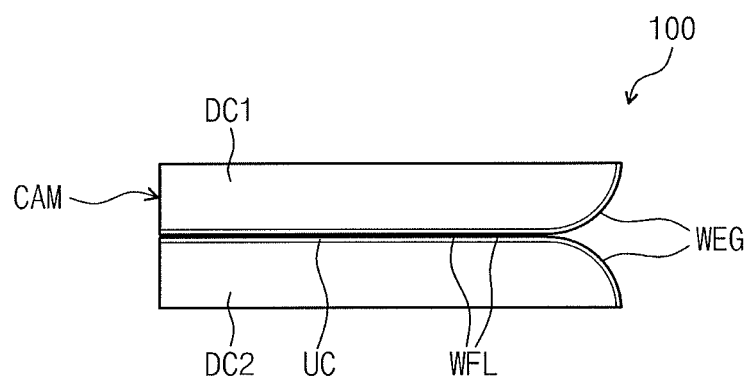
FIG. 11 illustrates the display apparatus of FIG. 9 in a folded state.
Figure 12:
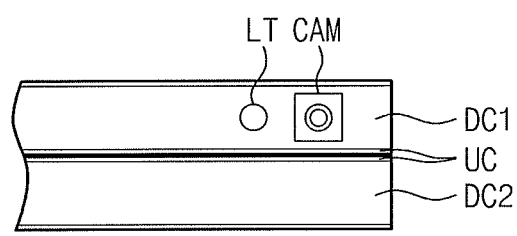
FIG. 12 illustrates a side part of the display apparatus in a folded state.
Figure 13:
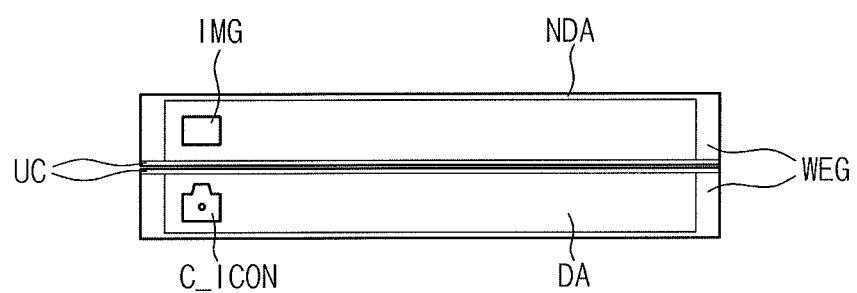
FIG. 13 illustrates an edge part of the display apparatus in a folded state.

FIG. 11 illustrates an example of the display apparatus 100 of FIG. 9 in a folded state. FIG. 12 illustrates a portion of a side part of the display apparatus 100 in the folded state. FIG. 13 illustrates the edge part of the display apparatus 100 in the folded state. In FIG. 11, the display apparatus 100 is folded in the second direction D2 for illustrative purposes only.

Referring to FIGS. 11, 12, and 13, the camera CAM and the flash LT are on the side part SP of the first lower case DC1. A camera icon C_ICON for operating the camera CAM and an image display part IMG for displaying an image photographed by the camera CAM may be displayed on the display area DA of the edge part EG.

The edge part EG may be divided with respect to the groove G. The camera icon C_ICON and the image display part IMG are displayed on different areas of the edge part EG with respect to the groove G. For example, when the display apparatus 100 is folded, the camera icon C_ICON may be displayed one side of the display area DA of the edge part EG and the image display part IMG may be displayed on another side of the display area DA of the edge part EG relative to the groove G. (These different areas of the edge part may be referred to as different edge parts).

In another embodiment, when the display apparatus 100 is in a folded state, the camera icon C_ICON and the camera CAM may be displayed on the same display area DA of the edge part EG (or the same edge part EG of two edge parts EG divided with respect to the groove G).

When the display apparatus 100 is folded, an image photographed through the camera CAM on a side surface of the display apparatus 100 in the first direction D1 may be displayed by the image display part IMG of the edge part EG for viewing by a user. The user may view the image displayed on the image display part IMG and touch the camera icon C_ICON to photograph a desired image. When the camera icon C_ICON is touched, the flash LT may operate. Thus, even when the display apparatus 100 is folded, the camera CAM may operate to photograph an image.

Figure 14:
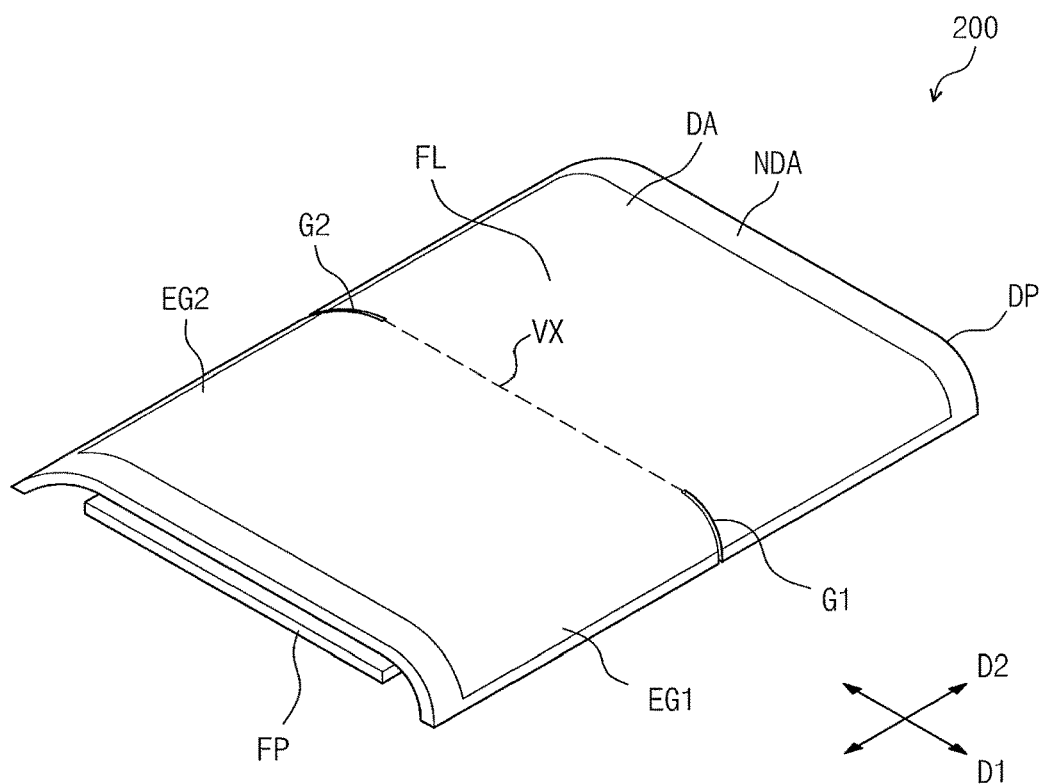
FIG. 14 illustrates another embodiment of a display apparatus.
Figure 15:
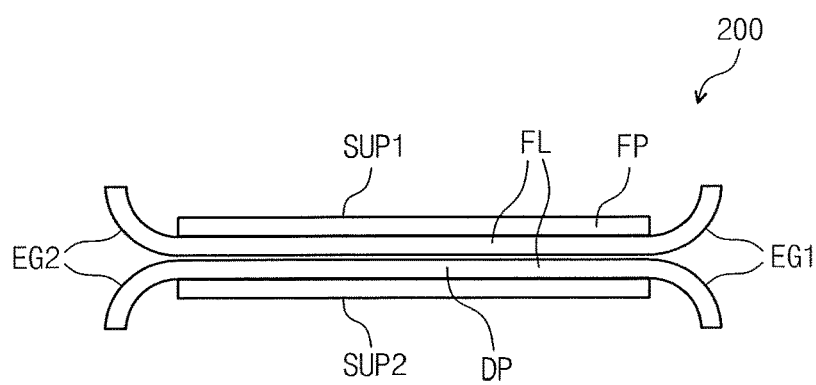
FIG. 15 illustrates the display apparatus in FIG. 14 in a folding state.

FIG. 14 illustrates another embodiment of a display apparatus 200, and FIG. 15 illustrating an embodiment of display apparatus 200 in a folded state. For illustrative purposes only, the display panel DP is illustrated as being folded when viewed from the second direction D2. The display apparatus 200 may have substantially the same constituent elements as the display apparatus 100 in FIG. 1, except for edge parts EG1 and EG2 which are on respective sides of the display panel DP.

Referring to FIGS. 14 and 15, the display apparatus 200 includes a display panel DP and a folding part FP disposed below the display panel DP. The display panel DP includes a first edge part EG1 on a predetermined area of one side of the display panel DP in the first direction D1, a second edge part EG2 on a predetermined area of the other side of the display panel DP in the first direction D1, and a flat part FL between the first and second edge parts EG1 and EG2.

The first edge part EG1 of the display panel DP may have the same shape as the edge part EG in FIG. 1. The second edge part EG2 may have a shape that is symmetrical to the shape of the first edge part EG1. The flat part FL has a flat shape. The display apparatus 200 including display panel DP may be an edge-type display apparatus 200.

The non-display area NDA may be on a predetermined area at one side of the first edge part EG1 in the first direction D1 and a predetermined area at upper and lower sides of the first edge part EG1 in the second direction D2. The non-display area NDA may be on a predetermined area at the side of the first edge part EG1 in the first direction D1 and a predetermined area at the upper and lower sides of the first edge part EG1 in the second direction D2. The non-display area NDA is on a predetermined area at upper and lower sides of the flat part FL. The display area DA may be on the flat part FL and the first and second edge parts EG1 and EG2, except for the non-display area NDA. Thus, a predetermined image may be displayed on the display area DA on the first and second edge parts EG1 and EG2.

In the first direction D1, the first edge part EG1 has one side bent downwardly and another side connected to the flat part FL. In the first direction D1, the second edge part EG2 has one side connected to the flat part FL and another side bent downwardly.

The first edge part EG1 is on a predetermined area of a central portion of the first edge part EG1 in the second direction D2, and includes a first groove G1 extending from the first edge part EG1 in the first direction D1. The second edge part EG2 is on a predetermined area of a central portion of the second edge part EG2 in the second direction D2, and includes a second groove G2 extending from the second edge part EG2 in the first direction D1. The first groove G1 and the second groove G2 overlap or are otherwise aligned relative to a virtual axis VX.

The folding part FP overlaps the flat part FL of the display panel DP and allows the display panel DP to be folded upwardly with respect to the virtual axis VX. In this embodiment, the first and second grooves G1 and G2 that overlap the virtual axis VS are defined in the first and second edge parts EG1 and EG2 of the display panel DP. As a result, the display panel DP may be easily folded. Thus, the display panel DP having the first and second edge parts EG1 and EG2 may be easily folded.

By way of summation and review, when an edge-type display panel does not have a groove, it is difficult to fold the display panel because the edge part has a curved shape. In accordance with one or more of the aforementioned embodiments, a flexible edge-type display includes a groove overlapping a virtual axis corresponding to the folding axis of a display panel. Thus, the display panel may be easily folded with respect to the virtual axis.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present embodiments as set forth in the following claims.

What is claimed is:
1. A display apparatus, comprising:
a display panel, the display panel being configured to fold along a folding axis that extends in a first direction and including a first edge part and a flat part connected to the first edge part, the first edge part having a curve that curves about an axis that extends in a second direction crossing the folding axis; and
a folding part, below the flat part, to fold the display panel, wherein:
the first edge part includes a first groove that penetrates the display panel in the curve, the first groove extending along the folding axis,
a display area of the display panel overlaps the folding axis,
the display panel further includes a second edge part, the first and second edge parts each having a respective curve that curves about an axis that extends in the first direction, the flat part being disposed between the first and second edge parts, the display panel further includes a second groove in the second edge part, the second groove penetrating the display panel in the curve of the second edge part and extending along the folding axis, and the first and second edge parts have substantially symmetrical shapes.

2. The display apparatus as claimed in claim 1, wherein the first edge part includes a first side that curves downwardly and a second side connected to the flat part.

3. The display apparatus as claimed in claim 1, wherein the display panel has a first side in the first direction and a second side in the second direction, the second side longer than the first side.

4. The display apparatus as claimed in claim 1, wherein the display panel includes:

a non-display area on a predetermined area at a left side of the flat part in the first direction, on a predetermined area at upper and lower sides of the flat part in the second direction, on a predetermined area at a right of the first edge part in the first direction, and on a predetermined area at upper and lower sides of the first edge part in the second direction; and the display area, the display area being on areas of the flat part and the first edge part except for the non-display area.

5. The display apparatus as claimed in claim 4, further comprising:

a plurality of pixels in the display area;

a plurality of scan lines to receive scan signals, the scan lines extending in the first direction and connected to the pixels;

a plurality of data lines to receive data voltages, the data lines extending in the second direction and connected to the pixels; and a plurality of emission lines to receive emission signals, the emission lines extending in the first direction and connected the pixels, wherein the data lines detour the first groove and extend in the second direction.

6. The display apparatus as claimed in claim 5, wherein:

when the display panel is folded, the data voltages are not applied to the pixels of the flat part and are applied to the pixels of the first edge part.

7. The display apparatus as claimed in claim 1, wherein the folding part overlaps a central portion of the display panel in the second direction and folds the display panel about the folding axis.

8. The display apparatus as claimed in claim 1, wherein the folding part includes:

a first support part connected at a first side of a rotational axis of the folding part in the second direction; and a second support part connected at a second side of the rotational axis in the second direction, wherein the rotational axis of the folding part is aligned with the folding axis of the display panel, and wherein the first and second support parts rotate about the rotational axis of the folding part.

9. The display apparatus as claimed in claim 1, further comprising:

a case to accommodate the display panel and the folding part.

10. The display apparatus as claimed in claim 9, wherein the case includes:

an upper case including a window edge part having substantially a same shape as the first edge part and a window flat part having substantially a same shape as the flat part; and a lower case to accommodate the display panel and the folding part, the lower case below the upper case.

11. The display apparatus as claimed in claim 10, wherein the window edge part includes a window groove that overlaps the first groove of the first edge part of the display panel, the window groove having substantially a same shape as the first groove.

12. The display apparatus as claimed in claim 10, wherein the lower case includes:

first and second lower cases connected at respective sides of a rotational axis of the case in the second direction, wherein the rotational axis of the case is aligned with the folding axis of the display panel, and wherein the first and second lower cases rotate about the rotational axis of the case.

13. The display apparatus as claimed in claim 10, further comprising:

a camera and a flash on a side part of the lower case opposite to the window edge part.

14. The display apparatus as claimed in claim 13, wherein the window edge part is to display a camera icon for operating the camera and includes an image display part for displaying an image photographed by the camera.

15. The display apparatus as claimed in claim 14, wherein the camera icon and the image display part are displayed on at least one of the first and second edge parts of the display panel and spaced apart with respect to the first groove.

16. The display apparatus as claimed in claim 1, wherein:

in the first direction, the first edge part has a first side curved downwardly and a second side connected to the flat part, and in the first direction, the second edge part has a first side connected to the flat part and a second side curved downwardly.

* * * * *